United States Patent
Matsuoka et al.

(10) Patent No.: US 9,007,795 B2
(45) Date of Patent: Apr. 14, 2015

(54) POWER CONVERSION DEVICE

(71) Applicant: Denso Corporation, Kariya, Aichi-pref. (JP)

(72) Inventors: Tetsuya Matsuoka, Kariya (JP);
Hiroyoshi Sawada, Nagoya (JP);
Makoto Okamura, Nisshin (JP);
Hiroshi Inamura, Kariya (JP); Yasuaki Aoki, Kariya (JP)

(73) Assignee: Denso Corporation, Kariya (JP)

( * ) Notice: Subject to any disclaimer, the term of this patent is extended or adjusted under 35 U.S.C. 154(b) by 146 days.

(21) Appl. No.: 13/846,462

(22) Filed: Mar. 18, 2013

(65) Prior Publication Data

US 2013/0272046 A1 Oct. 17, 2013

(30) Foreign Application Priority Data

Apr. 11, 2012 (JP) ................................. 2012-089988

(51) Int. Cl.
*H02M 7/5387* (2007.01)
*H02M 7/00* (2006.01)

(52) U.S. Cl.
CPC ............ *H02M 7/5387* (2013.01); *H02M 7/003* (2013.01)

(58) Field of Classification Search
CPC ... H02M 7/537; H02M 7/538; H02M 7/5387; Y02B 70/1441
USPC .................. 363/56.01, 56.02, 97, 98, 131.132
See application file for complete search history.

(56) References Cited

U.S. PATENT DOCUMENTS

| | | | |
|---|---|---|---|
| 5,365,424 A * | 11/1994 | Deam et al. | 363/144 |
| 2009/0231811 A1 | 9/2009 | Tokuyama et al. | |
| 2010/0315786 A1 | 12/2010 | Ochi et al. | |
| 2011/0199800 A1 * | 8/2011 | Yahata et al. | 363/131 |
| 2012/0147641 A1 * | 6/2012 | Yamaguchi et al. | 363/132 |
| 2013/0264891 A1 | 10/2013 | Sawada et al. | |

FOREIGN PATENT DOCUMENTS

| | | |
|---|---|---|
| JP | 2008-198750 | 8/2008 |
| JP | 2009-059887 | 3/2009 |
| JP | 2009-219270 | 9/2009 |
| JP | 2010-287737 | 12/2010 |
| JP | 2011-010496 | 1/2011 |
| JP | 2013-219892 | 10/2013 |

* cited by examiner

*Primary Examiner* — Adolf Berhane
*Assistant Examiner* — Yemane Mehari
(74) *Attorney, Agent, or Firm* — Nixon & Vanderhye PC

(57) ABSTRACT

The power conversion device includes a plurality of semiconductor modules, each having a main body section including a switching element therein. In a module unit, a positive module and a negative module are disposed such that main surfaces of the respective main body sections oppose each other. A positive terminal, a first intermediate terminal, a negative terminal, and a second intermediate terminal project in a Z direction perpendicular to X direction in which the positive module and the negative module oppose each other. A first vector $V_1$ from the positive terminal towards the first intermediate terminal and a second vector $V_2$ from the second intermediate terminal towards the negative terminal are configured such that these vector components $V_{12}$ and $V_{22}$ in a Y direction perpendicular to both the X and Z directions are opposite to each other.

15 Claims, 11 Drawing Sheets

POWER CONVERSION DEVICE

CROSS-REFERENCE TO RELATED APPLICATION

This application is based on and claims the benefit of priority from earlier Japanese Patent Application No. 2012-89988 filed Apr. 11, 2012, the description of which is incorporated herein by reference.

BACKGROUND OF THE INVENTION

1. Field of the Invention

The present invention relates to a power conversion device including a plurality of semiconductor modules having a semiconductor element. More exactly, the present invention relates to an inverter for a continuous current motor that can be mounted in a vehicle.

2. Description of the Related Art

A power conversion device that converts direct-current power from a power source to alternating-current power to drive a drive motor is mounted in electric cars, hybrid cars, and the like. The power conversion device performs power conversion by appropriately controlling the opening and closing of a semiconductor element (switching element) included within the semiconductor module. However, because inductance attributed to the wiring in internal circuits and the like is present, a surge voltage is generated in accompaniment with the opening and closing of the switching element. Such surge voltages may cause malfunction of the switching element. Therefore, reduction of the above-described inductance is required.

For example, in JP-A-2010-287737, a power conversion device is disclosed in which two semiconductor modules are serially connected and disposed adjacent to each other on an inductive conductor, such that the directions in which the current flows are opposite to each other. In the power conversion device, when the current flows to the semiconductor module, an induced current flows to the inductive conductor in the direction opposite to that of the current flowing to the semiconductor module. In the power conversion device, it is considered that the inductance attributed to wiring and the like can be reduced.

However, in the power conversion device disclosed in JP-A-2010-287737, the inductive conductor for sending the induced current is required to reduce the inductance. Therefore, problems occur in that the number of components increases, the size increases, and the like. In addition, when the induced current is used, a structure is required that facilitates induction of the induced current in the inductive conductor. A complicated structure is required to reduce the inductance.

Therefore, a power conversion device capable of sufficiently reducing inductance with a simple structure is desired.

SUMMARY

A power conversion device according to an aspect provided by the present application includes: a plurality of semiconductor modules each having a plate-shaped main body section including a switching element therein.

The plurality of semiconductor modules is composed of a positive module and a negative module. The positive module is connected to the positive side of a power supply and the negative module is connected to the negative side of the power supply.

In the positive module, a positive terminal and a first intermediate terminal are formed projecting from the main body section. The positive terminal is connected to the power supply. The first intermediate terminal is connected to the negative module.

In the negative module, a negative terminal and a second intermediate terminal are formed projecting from the main body section. The negative terminal is connected to the power supply. The second intermediate terminal is connected to the positive module.

The first intermediate terminal and the second intermediate terminal are connected by an intermediate bus bar.

In a module unit composed of one positive module and one negative module that are adjacent to each other and serially and electrically connected each other by the intermediate bus bar, the positive module and the negative module are disposed such that main surfaces of respective main body sections oppose each other.

The positive terminal and the first intermediate terminal that respectively belongs to the positive module, and the negative terminal and the second intermediate terminal that respectively belongs to the negative module project in a Z direction perpendicular to X direction in which the positive module and the negative module oppose each other.

a first vector $V_1$ and a second vector $V_2$ are configured such that the directions of respective vector components $V_{12}$ and $V_{22}$ in a Y direction perpendicular to both the X direction and the Z direction are opposite to each other. The first vector $V_1$ is from the positive terminal of the positive module towards the first intermediate terminal. The second vector $V_2$ is from the second intermediate terminal of the negative module towards the negative terminal (a power conversion device according to a first aspect of the present invention).

As described above, in the power conversion device according to an aspect of the present application, the positive module and the negative module of the module unit are disposed such that the main surfaces of the respective main body sections oppose each other. In addition, when the module unit is viewed from the Z direction, the first vector from the positive terminal of the positive module towards the first intermediate terminal and the second vector from the second intermediate terminal of the negative module towards the negative terminal are configured such that the directions of the respective vector components in the Y direction are opposite to each other.

Therefore, when a switching operation of the switching element is performed, in an instance in which a current flows through a closed circuit formed including the positive module, the intermediate bus bar, and the negative module, the directions of the current flowing to the positive module and the current flowing to the negative module are opposite to each other in the perpendicular direction. The positive module and the negative module are disposed such as to oppose each other. In other words, the directions of the current flowing from the positive terminal of the positive module through the main body section to the first intermediate terminal and the current flowing from the second intermediate terminal of the negative terminal through the main body section to the negative terminal are opposite to each other in the Y direction.

As a result, the mutual inductance occurring between the positive module and the negative module can be sufficiently reduced (referred to as a "mutual inductance effect"). As a result, for example, unlike conventional power conversion devices, an inductive conductor for sending an induced current is no longer required. Reduction of inductance can be sufficiently achieved with a simple structure. In particular, the positive module and the negative module are disposed in a state in which the main surfaces of the respective main body sections having a large area are opposing each other, or in other words, such that the opposing areas of the positive module and the negative module are large. Therefore, the above-described mutual inductance effect can be enhanced, and further reduction of inductance can be achieved.

In the power conversion device, the main surface of the main body section of the semiconductor module is a surface perpendicular to the thickness direction of the plate-shaped main body section and has the largest area.

In addition, the main body section of the positive module of the module unit can be configured to have a conductive section enabling electrical conduction between the positive terminal and the first intermediate terminal via the switching element. In addition, the main body section of the negative module of the module unit can be configured to have a conductive section enabling electrical conduction between the negative terminal and the second intermediate terminal via the switching element (a power conversion device according to a second aspect of the present invention). In this instance, the directions of the current flowing to the conductive section of the positive module and the current flowing to the conductive section of the negative module can be opposite to each other in the Y direction. The above-described mutual inductance effect can be sufficiently achieved.

Here, the conductive section can be at least partially exposed on the main surfaces of the main body section (a power conversion device according to a third aspect of the present invention). In this instance, compared to a configuration in which the conductive section is not exposed on the main surfaces of the main body section, the respective conductive sections of the positive module and the negative module, through which the respective currents flow in X directions, can be placed closer to each other. Therefore, the above-described mutual inductance effect can be enhanced. In addition, as a result of the conductive section being exposed, heat-radiating effect can also be enhanced.

In addition, the main body section of the positive module of the module unit can be configured to have a pair of conductive sections that are disposed on both sides of the switching element in the X direction. The conductive section is connected to the positive terminal and the conductive section is connected to the first intermediate terminal. In addition, the main body section of the negative module can be configured to have a pair of conductive sections that are disposed on both of the switching element sides in X direction. The conductive section is connected to the negative terminal and the conductive section is connected to the second intermediate terminal (a power conversion device according to a fourth aspect of the present invention). In this instance, the pair of conductive sections serving as a current path are disposed on both sides of the switching element of the main body section in the X direction, or in other words, on both main surface sides of the main body section. As a result, the opposing area between the conductive sections of the positive module and the conductive sections of the negative module can be increased. The above-described mutual inductance effect can be enhanced.

In addition, in the respective main body sections of the positive module and the negative module of the module unit, a diode can be aligned in the Y direction with the switching element. The switching element of the positive module and the diode of the negative module can be disposed to oppose each other in the X direction. Furthermore, the diode of the positive module and the switching element of the negative module can be disposed such as to oppose each other in the X direction (a power conversion device according to a fifth aspect of the present invention). In this instance, the current path from the positive terminal of the positive module to the negative terminal of the negative module can be simplified. The above-described mutual inductance effect can be sufficiently achieved. The switching element and the diode may be configured separately, as described above, or may be integrated.

In addition, when the module unit is viewed from the Z direction, in the positive module, the switching element and the positive terminal can be disposed to oppose each other in the X direction. The diode and the first intermediate terminal can be disposed to oppose each other in the X direction. In addition, in the negative module, the switching element and the second intermediate terminal can be disposed to oppose each other in the X direction. The diode and the negative terminal can be disposed to oppose each other in the X direction (a power conversion device according to a sixth aspect of the present invention). In this instance, the current path from the positive terminal of the positive module to the negative terminal of the negative module can be further simplified. The above-described mutual inductance effect can be sufficiently achieved.

In addition, the power conversion device can be configured to include a plurality of module units. In the module units that are adjacent to each other, the positive module of one module unit and the negative module of the other module unit can be disposed such that the main surfaces of the respective main body sections oppose each other (power conversion device according to a seventh aspect of the present invention). In this instance, when the directions of the current flowing to the positive module of one module unit and the current flowing to the negative module of the other module unit are made opposite to each other in the Y direction, the mutual inductance effect between the module units that are adjacent to each other can also be achieved. As a result, further reduction in inductance can be achieved.

In addition, the above-described power conversion device can be configured to include a cooler that has a coolant path for sending a coolant that cools the semiconductor modules. The semiconductor modules and the coolant path can be alternately stacked in the X direction (a power conversion device according to an eighth aspect of the present invention). In this instance, the semiconductor module can be efficiently cooled from the main surface sides of the main body section by the coolant flowing through the coolant path of the cooler.

As described above, the power conversion device provided by the present application is capable of sufficiently reducing inductance with a simple structure.

DETAILED DESCRIPTION OF THE PREFERRED EMBODIMENTS

A power conversion device according to the embodiments will hereinafter be described with reference to the drawings.

First Embodiment

Figure 7:
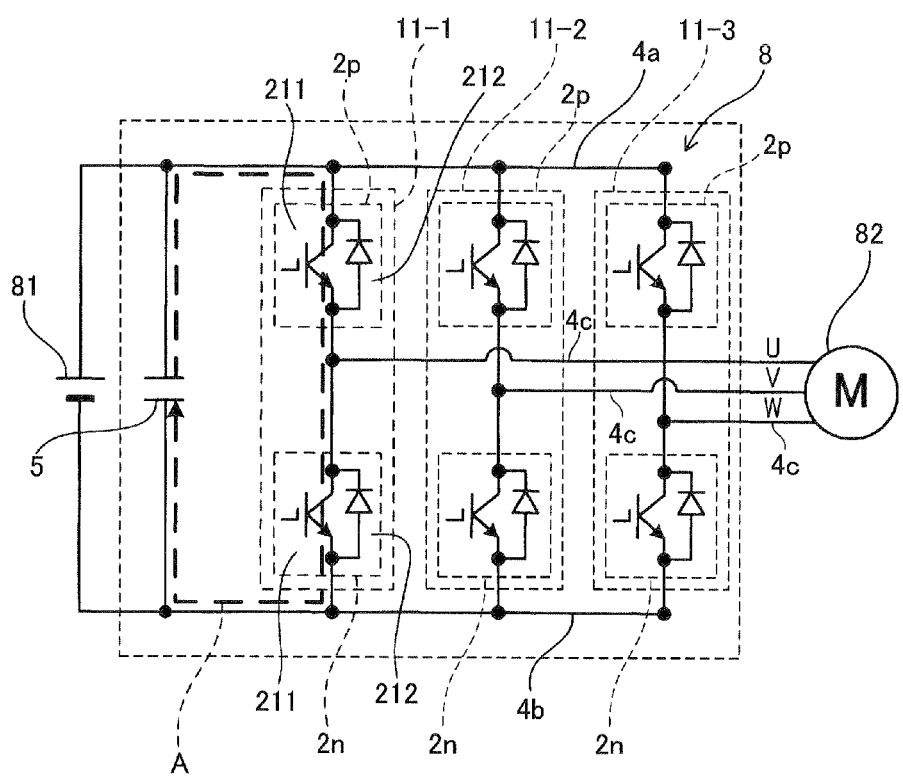
FIG. 7 shows an explanatory circuit diagram of a power conversion circuit according to the first embodiment.

Firstly, a power conversion circuit in the power conversion device 1 will be described according to FIG. 7. As shown in FIG. 7, a power conversion circuit 8 is configured by the power supply 81 (direct-current power supply 81), the capacitor 5, the six semiconductor modules 2 (three positive modules 2p and three negative modules 2n), and the like. Among the semiconductor modules 2, the positive modules 2p each have the upper arm-side switching element 211 and the upper arm-side diode 212 that is connected in inverse parallel with the switching element 211. In addition, the negative modules 2n each have the lower arm-side switching element 211 and the lower arm side diode 212 that is connected in inverse parallel with the switching element 211.

The switching element 211 of the positive module 2p is connected to the positive bus bar 4a. The switching element 211 of the negative module 2n is connected to the negative bus bar 4b. The intermediate bus bar 4c is connected to the three-phase alternating-current motor 82. As a result of the switching operation of the switching element 211 of the semiconductor module 2 being controlled by external control board (not shown), the direct-current power of the power supply 81 is converted to alternating-current power. The three-phase alternating-current motor 82 is driven using the alternating-current power. One pair of one positive module 2p and one negative module 2n is configured as an interactive one unit 11 (hereinafter referred to as "module unit"). The power conversion device 1 has three module units 11 (11-1 to 11-3) therein.

Figure 3:
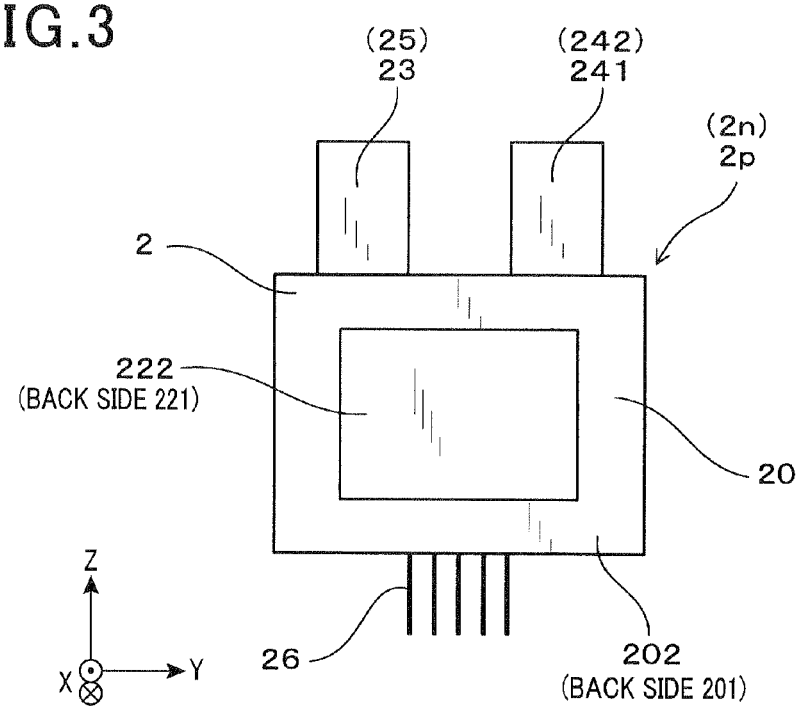
FIG. 3 shows an explanatory diagram (front view) of the semiconductor module according to the first embodiment.

Next, the semiconductor module will be explained. FIG. 3 shows an appearance (front view) of a semiconductor module 2. As shown in FIG. 3, the positive module 2p and the negative module 2n each have a switching element 211 and a diode 212. The switching element 211 is composed of an insulated-gate bipolar transistor (IGBT) or the like. The diode 212 is composed of a free-wheeling diode (FWD) or the like that is connected in inverse parallel with the switching element 211. The switching element 211 and the diode 212 are included within the plate-shaped main body section 20 composed of an insulating resin or the like.

As shown in FIG. 3, the positive module 2p has the positive terminal 23 and the first intermediate terminal 241. The positive terminal 23 and the first intermediate terminal 241 are formed projecting from the main body section 20. The negative module 2n has the negative terminal 25 and the second intermediate terminal 242. The negative terminal 25 and the second intermediate terminal 242 are formed projecting from the main body section 20. The positive terminal 23, the first intermediate terminal 241, the negative terminal 25, and the second intermediate terminal 242 all project in the same direction.

In addition, the positive module 2p and the negative module 2n each have a plurality of control terminals 26 connected to an external control circuit board (not shown). The plurality of control terminals 26 are provided projecting from the main body sections 20 on the side opposite to the positive terminal 23, the negative terminal 25, the first intermediate terminal 241, and the second intermediate terminal 242. A control circuit that controls a switching operation of the switching element 211 in the semiconductor module 2 is formed on the control circuit board.

Figure 1:
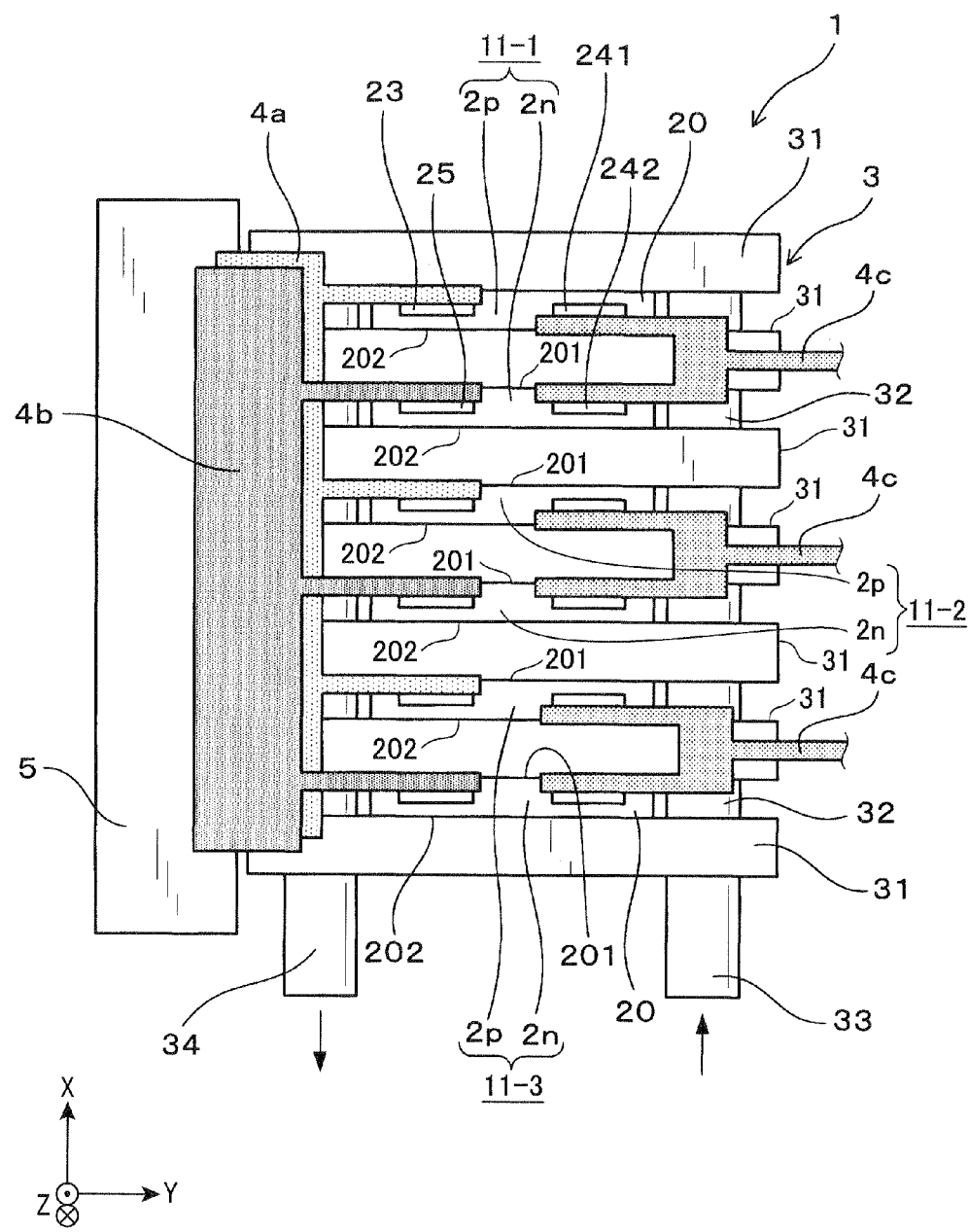
FIG. 1 shows an explanatory diagram (top view) of a power conversion device according to a first embodiment.

Next, a structure of the power conversion device will be explained. FIG. 1 shows a front view of the power conversion device 1. As shown in FIG. 1, the semiconductor module 2 (2n, 2p) is respectively has a plate-shaped main body section 20 including the switching element 211 and diode 212 therein. The positive module 2p is connected to the positive pole of a power supply 81 and the negative module 2n is connected to the negative pole of the power supply 81.

As shown in FIG. 1, in the positive module 2p, a positive terminal 23 and a first intermediate terminal 241 are formed projecting from the main body section 20. The positive terminal 23 is connected to a positive pole of the power supply 81. The first intermediate terminal 241 is connected to the negative module 2n. In the negative module 2n, a negative terminal 25 and a second intermediate terminal 242 are formed projecting from the main body section 20. The negative terminal 25 is connected to a negative pole of the power supply 81. The second intermediate terminal 242 is connected to the positive module 2p. The first intermediate terminal 241 and the second intermediate terminal 242 are connected by an intermediate bus bar 4c.

As shown in FIG. 1, in a module unit 11 composed of the positive module 2p and the negative module 2n that are adjacent to each other and connected by the intermediate bus bar 4c, the positive module 2p and the negative module 2n are disposed such that a main surface 201 and a main surface 202 of the respective main sections 20 oppose each other. Here, "the main surface" is a surface perpendicular to the thickness direction of the plate-shaped main body section and has the largest area (see FIG. 3). The positive terminal 23 and the first intermediate terminal 241 that respectively belongs to the positive module 2p, and the negative terminal 25 and the second intermediate terminal 242 that respectively belongs to the negative module 2n project in a Z direction that is perpendicular to an X direction in which the positive module 2p and the negative module 2n oppose to each other.

Also, as shown in FIG. 1, the power conversion device 1 includes the plurality of semiconductor modules 2, a cooler 3, a plurality of bus bars (a positive bus bar 4a, a negative bus bar 4b, and the intermediate bus bar 4c, described hereafter), a capacitor 5, and the like that are housed in a casing (not shown) or the like. The cooler 3 is used to cool the semiconductor modules 2. The plurality of semiconductor modules 2 is composed of three positive modules 2p and three negative modules 2n.

As shown in FIG. 1, the positive terminals 23 of the positive modules 2p are connected to a single, common positive bus bar 4a. The negative terminals 25 of the negative modules 2n are connected to a single, common negative bus bar 4b. One end of the positive bus bar 4a is connected to a positive terminal 23 of the capacitor 5. One end of the negative bus bar 4b is connected to the negative terminal 25 of the capacitor 5. The positive terminal 23 of the capacitor 5 is connected to the positive pole of the power supply 81, and the negative terminal 25 of the capacitor 5 is connected to the negative pole of the power supply 81.

In addition, the first intermediate terminals 241 of the positive modules 2p and the second intermediate terminals 242 of the negative modules 2n are connected, per module unit 11, to a single, common intermediate bus bar 4c. In other words, the first intermediate terminal 241 and the second intermediate terminal 242 are connected by the intermediate bus bar 4c. According to the first embodiment, because there are three module units 11, there are also three intermediate bus bars 4c. Each of three intermediate bus bars 4c is connected to a U-phase winding, a V-phase winding, and a W-phase winding (not shown) of a three-phase alternating-current motor 82 (see FIG. 7) driven by the power conversion device 1.

Figure 2:
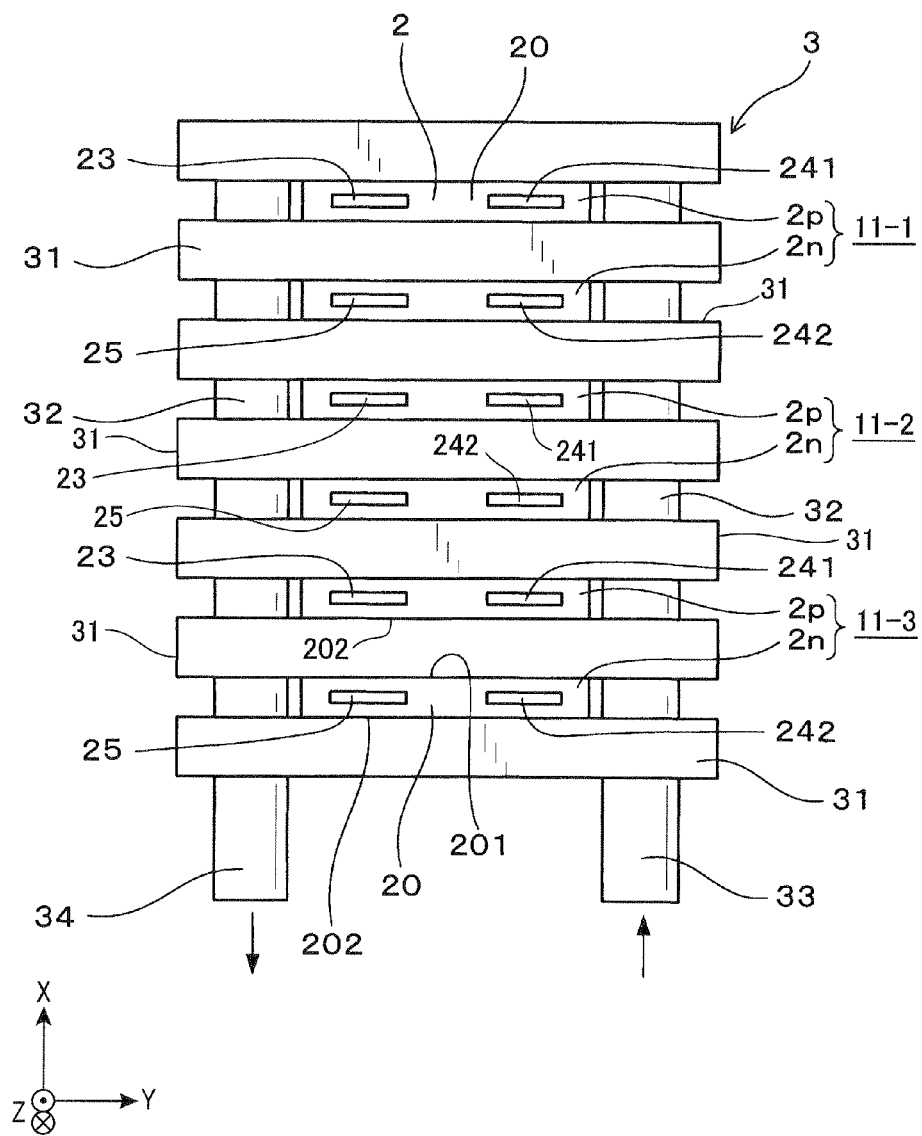
FIG. 2 shows an explanatory diagram of semiconductor modules and a cooler according to the first embodiment.

FIG. 2 shows a positional relation of semiconductor modules 11 and a cooler 3 for the semiconductor modules 11. As shown in FIG. 2, the positive module 2p and the negative module 2n that are serially and electrically connected by the intermediate bus bar 4c, described hereafter, configure a single module unit 11. According to the first embodiment, there are three module units 11 (11-1 to 11-3). In the module unit 11, the positive module 2p and the negative module 2n are arranged in a stack such that the main surface 201 and the main surface 202 of the respective main body sections 20 oppose each other.

In addition, in the module units 11 that are adjacent to each other, the positive module 2p of one module unit 11 and the negative module 2n of the other module unit 11 are arranged in a stack such that the main surface 201 and the main surface 202 of the respective main body sections 20 oppose each other. In other words, the positive module 2p and the negative module 2n are arranged such as to be alternately stacked. The positive terminal 23 and the negative terminal 25 are arranged alternately in a row in the X direction. The first intermediate terminal 241 and the second intermediate terminal 242 are arranged alternately in a row in the X direction.

As shown in FIG. 2, the cooler 3 has a plurality of cooling tubes 31 serving as a coolant path through which a coolant flows. The coolant cools the semiconductor modules 2. The semiconductor modules 2 and the cooling tubes 31 are arranged alternately in the X direction. Each semiconductor module 2 is sandwiched from both sides in the X direction by the cooling tubes 31.

The cooling tubes 31 that are adjacent to each other in the X direction are connected by deformable connecting tubes 32 in both end portions. A coolant inlet tube 33 and a coolant discharge tube 34 are connected to both end portions of the cooling tube 31 disposed on one end in the X direction, among the plurality of cooling tubes 31. The coolant inlet tube 33 is used to introduce the coolant from outside. The coolant discharge tube 34 is used to discharge the coolant outside.

In the cooler 3, the coolant that has been introduced into the coolant inlet tube 33 from outside passes through the connecting tube 33 on the coolant inlet tube 33 side, and flows through each cooling tube 31. The coolant that flows through each cooling tube 31 performs heat exchange with the semiconductor modules 2. After performing heat exchange, the coolant passes through the connecting tube 32 on the coolant discharge tube 34 side and is discharged outside from the coolant discharge tube 34.

As the coolant that flows through the cooler 3, for example, a natural coolant such as water or ammonia, water mixed with an ethylene-glycol-based anti-freeze solution, a fluorocarbon-based coolant such as Fluorinert, a Freon-based coolant such as HCFC123 or HCFC134a, an alcohol-based coolant such as methanol or alcohol, or a ketone-based coolant such as acetone can be used.

Figure 4:
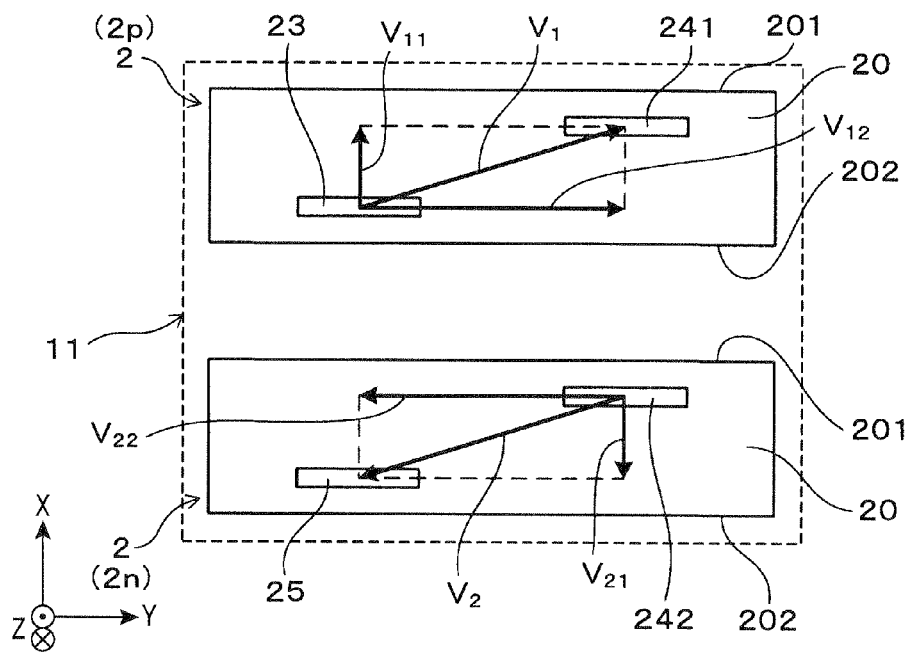
FIG. 4 shows a top view of a module unit according to the first embodiment.

Hereafter, the positive module 2p and the negative module 2n in the module unit 11 will be described in further detail. FIG. 4 shows a top view of the module unit 11. In FIG. 4, only the main body sections 20, the positive terminal 23, the first intermediate terminal 241, the negative terminal 25, and the second intermediate terminal 242 are shown.

As shown in FIG. 4, when the module unit 11 (positive module 2p and negative module 2n) is viewed from the Z direction, a vector of which the starting point is the positive terminal 23 of the positive module 2p and the ending point is the first intermediate terminal 241 is the first vector $V_1$. In addition, a vector of which the starting point is the second intermediate terminal 242 of the negative module 2n and the ending point is the negative terminal 25 is the second vector $V_2$.

A vector component in the X direction of the first vector $V_1$ is $V_{11}$, and a vector component in the Y direction is $V_{12}$. A vector component in the X direction of the second vector $V_2$ is $V_{21}$, and a vector component in the Y direction is $V_{22}$. In this instance, the directions of the vector component $V_{12}$ in the Y direction of the first vector $V_1$ and the vector component $V_{22}$ in the Y direction of the second vector $V_2$ are opposite to each other.

Figure 5:
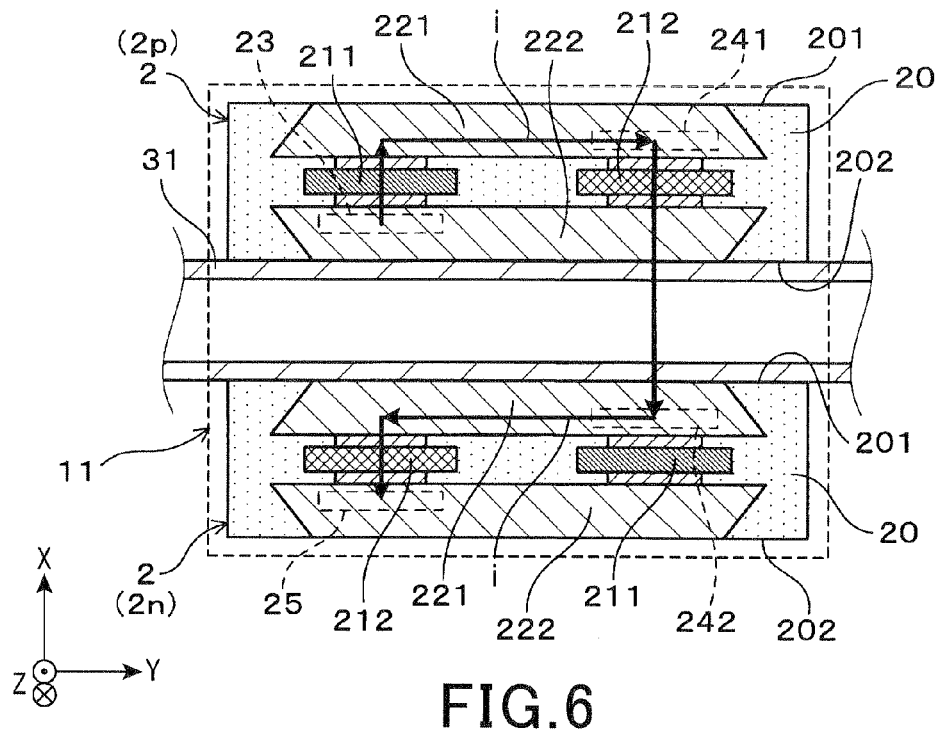
FIG. 5 shows a flow of a current (i) when a switching element 211 of a positive module 2$p$ is switched from OFF to ON according to the first embodiment.
Figure 6:
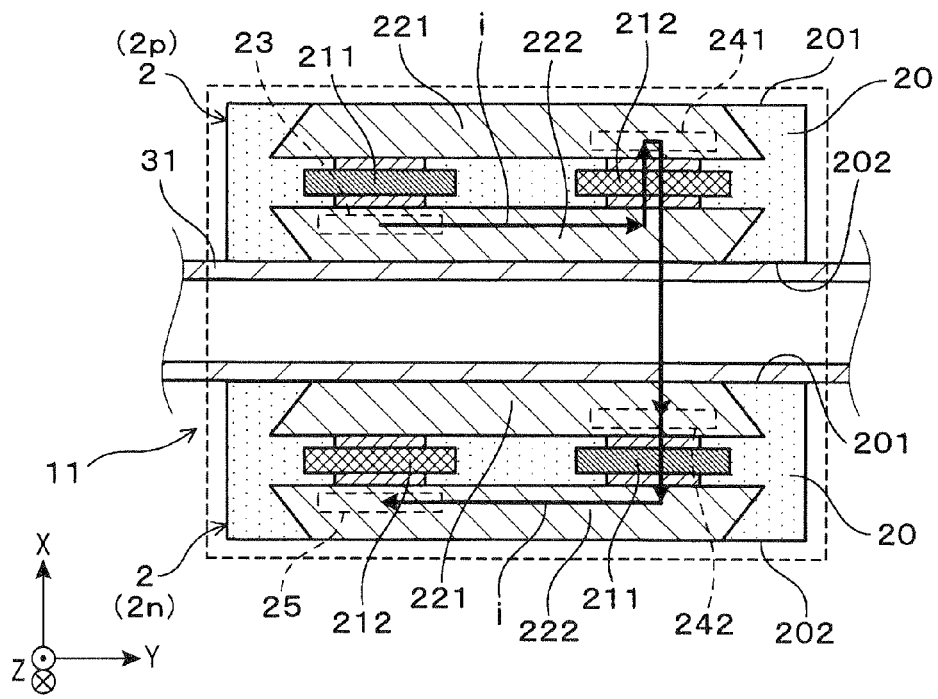
FIG. 6 shows a flow of a current (i) when a switching element 211 of a negative module 2$n$ is switched OFF to ON according to the first embodiment.

FIG. 5 and FIG. 6 are diagrams of the positive module 2p and the negative module 2n of the module unit 11, and the cooling tubes 31 provided therebetween, showing a X-Y cross-section taken in a direction perpendicular to the Z direction.

As shown in FIG. 5 and FIG. 6, each main body sections 20 of the positive module 2p and the negative module 2n have the switching element 211 and the diode 212, as described above. The switching element 211 and the diode 212 are aligned in the Y direction. The switching element 211 of the positive module 2p and the diode 212 of the negative module 2n are disposed such as to oppose each other in the X direction. The diode 212 of the positive module 2p and the switching element 211 of the negative module 2n are disposed such as to oppose each other in the X direction.

The main body section 20 of the positive module 2p has a pair of conductive sections 221 and 222. The pair of conductive sections 221 and 222 are provided to enable electrical conduction between the positive terminal 23 and the first intermediate terminal 241 via the switching element 211. The main body section 20 of the negative module 2n has a pair of conductive sections 221 and 222. The pair of conductive sections 221 and 222 are provided to enable electrical conduction between the negative terminal 25 and the second intermediate terminal 242 via the switching element 211. The pair of conductive sections 221 and 222 are disposed on both sides in the X direction of the switching element 211 and the diode 222, and electrically connect the switching element 211 and the diode 222. In addition, the pair of conductive sections 221 and 222 are at least partially exposed from the main surfaces 201 and 202 of the main body section 20.

As shown in FIG. 5 and FIG. 6, in the main body section 20 of the positive module 2p, the positive terminal 23 and the first intermediate terminal 241 are disposed on both sides in the Y direction of the switching element 211 and the diode 212. The positive terminal 23 is disposed in a position near the negative module 2n and is connected to one conductive section 222. The first intermediate terminal 241 is disposed in a position far from the negative module 2n and is connected to the other conductive section 221.

In addition, in the main body section 20 of the positive module 2p, the positive terminal 23 and the first intermediate terminal 241 are disposed in different positions in Y direction. The positive terminal 23 is aligned in the X direction with the switching element 211. The first intermediate terminal 241 is aligned in the X direction with the diode 212.

As shown in FIG. 5 and FIG. 6, in the main body section 20 of the negative module 2n, the negative terminal 25 and the second intermediate terminal 242 are disposed on both sides in the Y direction of the switching element 211 and the diode 212. The negative terminal 25 is disposed on the side far from the positive module 2p and is connected to one conductive section 222. The second intermediate terminal 242 is disposed on the side near the positive module 2p and is connected to the other conductive section 221.

In addition, in the main body section 20 of the negative module 2n, the negative terminal 25 and the second intermediate terminal 242 are disposed in positions that differ in the Y direction. The negative terminal 25 is aligned in the X direction with the diode 212. The second intermediate terminal 242 is aligned in the X direction with the switching element 211.

(Operational Effects of the First Embodiment)

Next, operational effects achieved by the power conversion device 1 according to the first embodiment will be described. As described above, in the power conversion device 1 according to the first embodiment, the positive module 2p and the negative module 2n of the module unit 11 are disposed such that the main surface 201 and the main surface 202 of the respective main body sections 20 oppose each other. In addition, when the module unit 11 is viewed from the Z direction, the directions of the vector component $V_{12}$ in the Y direction of the first vector $V_1$ (from the positive terminal 23 towards the first intermediate terminal 241 in the positive module 2p) and the vector component $V_{22}$ in the Y direction of the second vector $V_2$ (from the intermediate terminal 242 towards the negative terminal 25 in the negative module 2n) are opposite to each other.

Therefore, when the switching operation of the switching element 211 is performed, in an instance in which a current flows through a closed circuit formed including the positive module 2p, the intermediate bus bar 4c, and the negative module 2n, the directions of the current flowing through the positive module 2p and the current flowing through the negative module 2n can be made opposite to each other in Y direction. The positive module 2p and the negative module 2n are disposed such as to oppose each other. In other words, the direction of the current flowing from the positive terminal 23 of the positive module 2p through the main body section 20 to the first intermediate terminal 241 and the direction of the current flowing from the second intermediate terminal 242 of the negative module 2n through the main body section 20 to the negative terminal 25 are opposite to each other in the Y direction.

Specifically, when the switching operation of the switching element 211 is performed, the flow and the size of the current flowing to the circuit in the power conversion device 1 change. At this time, considering the closed circuit formed in the power conversion device 1, the direction and the size of the current flowing to the closed circuit change. According to the first embodiment, this will be described considering a closed circuit A (see FIG. 7) formed including the positive module 2p, the intermediate bus bar 4c, and the negative module 2n.

For example, when the switching element 211 of the positive module 2p (upper arm-side) is switched from ON to OFF, a circulating current flows through the diode 212 of the negative module 2n (lower arm-side) in a direction maintaining the current of the three-phase alternating-current motor 82. The circulating current is a current flowing in a forward direction of the diode 212 of the negative module 2n (lower arm-side). Next, when the switching element 211 of the positive module 2p (upper arm side) is switched from OFF to ON, a recovery current flows to the diode 212 of the negative module 2n (lower arm-side). The recovery current refers to a current that flows in a reverse direction of the diode 212 when a reverse voltage is applied after the current has flowed in the forward direction of the diode 212.

Here, afore-mentioned FIG. 5 shows the flow of a current i when the switching element 211 of the positive module 2p is switched from OFF to ON. The current i indicates an alternating-current component that successively changes as a result of the switching operation of the switching element 211. The current i flows in order from the positive terminal 23 of the positive module 2p, through the conductive section 222, the switching element 211, the conductive section 221, to the first intermediate terminal 241. Then, the current i flows through the intermediate bus bar 4c (not shown) and flows in order from the second intermediate terminal 242 of the negative module 2n, the conductive section 221, the diode 212, the conductive section 222, to the negative terminal 255. Here, considering the current i flowing in the Y direction, the direction of the current i flowing to the conductive section 221 of the positive module 2p and the direction of the current i flowing to the conductive section 221 of the negative module 2n are opposite to each other.

Also, afore-mentioned FIG. 6 shows the flow of the current i when the switching element 211 of the negative module 2n is switched from OFF to ON, in a manner similar to FIG. 5. The current i flows in order from the positive terminal 23 of the positive module 2p, through the conductive section 222, the diode 212, the conductive section 221, to the first intermediate terminal 241. Then, the current i flows through the intermediate bus bar 4c (not shown) and flows in order from the second intermediate terminal 242 of the negative module 2n, through the conductive section 221, the switching element 211, the conductive section 222, to the negative terminal 25. Here, considering the current i flowing in the Y direction, the direction of the current i flowing to the conductive section 222 of the positive module 2p and the direction of the current i flowing to the conductive section 222 of the negative module 2n are opposite to each other.

Therefore, an effect of reducing mutual inductance occurring between the positive module 2p and the negative module 2n (mutual inductance effect) can be sufficiently achieved. As a result, for example, unlike conventional power conversion devices, an inductive conductor for sending an induced current is no longer required. Reduction of inductance can be sufficiently achieved with a simple structure. In particular, the positive module 2p and the negative module 2n are disposed in a state in which the main surface 201 and the main surface 202 of the respective main body sections 20 having a larger area are opposing each other, or in other words, such that the opposing areas of the positive module 2p and the negative module 2n are large. Therefore, the above-described mutual inductance effect can be enhanced, and further reduction of inductance can be achieved still more.

In addition, according to the first embodiment, the main body section 20 of the positive module 2p of the module unit 11 has the conductive sections 221 and 222 enabling electrical conduction between the positive terminal 23 and the first intermediate terminal 241 via the switching element 211. The main body section 20 of the negative module 2n has the conductive sections 221 and 222 enabling electrical conduction between the negative terminal 25 and the second intermediate terminal 242 via the switching element 211. Therefore, the directions of the current flowing through the conductive sections 221 and 222 of the positive module 2p and the current flowing through the conductive sections 221 and 222 of the negative module 2n can be opposite to each other in the Y direction. The above-described mutual inductance effect can be sufficiently achieved.

In addition, the conductive sections 221 and 222 are at least partially exposed on the main surfaces 201 and 202 of the main body section 20. Therefore, compared to a configuration in which the conductive sections 221 and 222 are not exposed on the main surfaces 201 and 202 of the main body section 20, the respective conductive sections 221 and 222 of the positive module 2p and the negative module 2n through which the respective currents flow in X directions can be placed closer to each other. Therefore, the above-described mutual inductance effect can be enhanced. In addition, as a result of the conductive sections 221 and 222 being exposed, heat-radiating effect can also be enhanced.

The main body section 20 of the positive module 2p of the module unit 11 has the pair of conductive sections 221 and 222 that are disposed on both sides in the X direction of the switching element 211. The conductive section 222 is connected to the positive terminal 23 and the conductive section 221 is connected to the first intermediate terminal 241. In addition, the main body section 20 of the negative module 2n has the pair of conductive sections 221 and 222 that are disposed on both sides in the X direction of the switching element 211. The conductive section 222 is connected to the negative terminal 25 and the conductive section 222 is connected to the second intermediate terminal 242. Therefore, the pair of conductive sections 221 and 222 serving as a current path are disposed on both sides in the X direction of the switching element 211 of the main body section 20, or in other words, on both main surface 201 and 202 sides of the main body section 20. As a result, the opposing area between the conductive sections 221 and 222 of the positive module 2p and the conductive sections 221 and 222 of the negative modules 2n can be increased. The above-described mutual inductance effect can be enhanced.

In the respective main body sections 20 of the positive module 2p and the negative module 2n of the module unit 11, the diode 212 is aligned in the Y direction with the switching element 211. The switching element 211 of the positive module 2p and the diode 212 of the negative module 2n are disposed such as to oppose each other in the X direction. The diode 212 of the positive module 2p and the switching element 211 of the negative module 2n are disposed such as to oppose each other in the X direction. As a result, the current path from the positive terminal 23 of the positive module 2p to the negative terminal 25 of the negative module 2n can be simplified. The above-described mutual inductance effect can be sufficiently achieved.

In addition, when the module unit 11 is viewed from the Z direction, in the positive module 2p, the switching element 211 and the positive terminal 23 are aligned in the X direction. The diode 212 and the first intermediate terminal 241 are aligned in the X direction. Also in the negative module 2n, the switching element 211 and the second intermediate terminal 242 are aligned in the X direction. Also the diode 212 and the negative terminal 25 are aligned in the X direction. As a result, the current path from the positive terminal 23 of the positive module 2p to the negative terminal 25 of the negative module 2n can be further simplified. The above-described mutual inductance effect can be sufficiently achieved.

In addition, the power conversion device 1 includes a plurality of module units 11. In the module units 11 that are adjacent to each other, the positive module 2p of one module unit 11 and the negative module 2n of the other module unit 11 are disposed such that the main surface 201 and the main surface 202 of the respective main body sections 20 oppose each other. Therefore, the directions of the current flowing to the positive module 2p of one module unit 11 and the current flowing to the negative module 2n of the other module unit 11 are made opposite to each other in the Y direction. The mutual inductance effect between the module units 11 that are adjacent to each other can also be achieved. As a result, further reduction of induction can be achieved still more.

In addition, the power conversion device 1 includes the cooler 3 having the cooling tubes (coolant path) 31 for sending the coolant that cools the semiconductor modules 2. The semiconductor modules 2 and the cooling tubes 31 are alternately stacked in the X direction. As a result, the semiconductor module 2 can be efficiently cooled from the main surface 201 and 202 sides of the main body section 20 by the coolant flowing through the cooling tubes 31 of the cooler 3.

As described above, according to the first embodiment, the power conversion device 1 can be provided that is capable of sufficiently reducing inductance with a simple structure.

Second Embodiment

Figure 8:
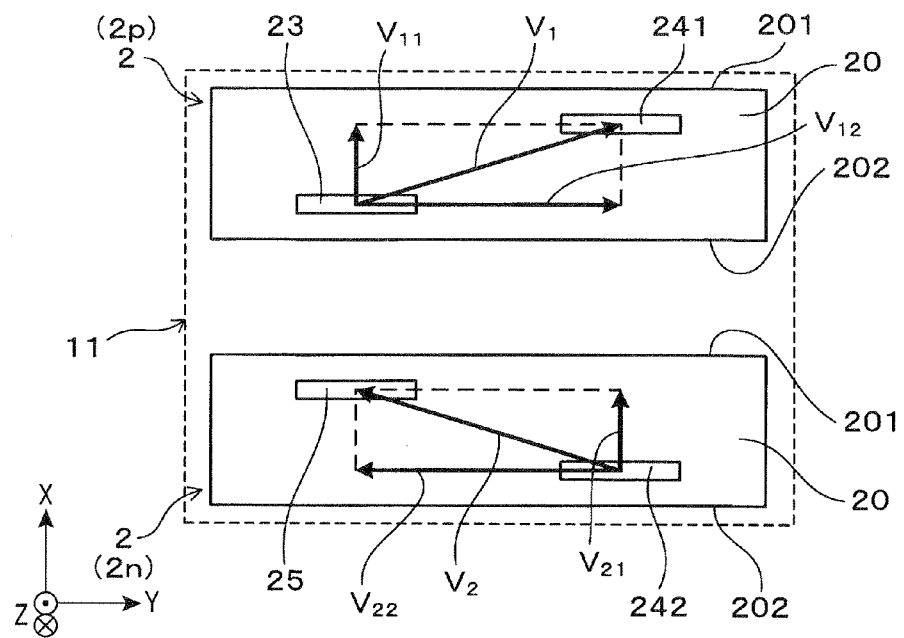
FIG. 8 shows a top view of an altered arrangement of the module unit according to the second embodiment.
Figure 9:
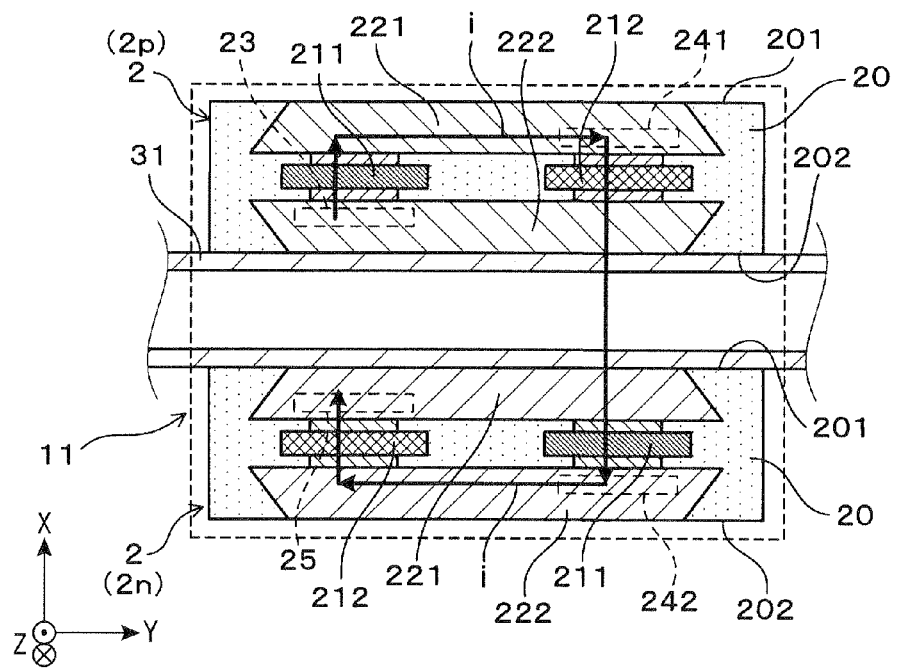
FIG. 9 shows a flow of a current (i) when a switching element 211 of the positive module 2p is switched from OFF to ON according to the second embodiment.

Next, a second embodiment of the power conversion device will be explained using FIG. 8 to FIG. 10. The second embodiment is an altered example of the module unit 11, especially an arrangement of the negative terminal 25 and the second intermediate terminal 242 of the negative module 2n. FIG. 8 shows a top view of an altered arrangement of the module unit 11.

As shown in FIG. 8, according to the second embodiment, in the main body section 20 of the negative module 2n, the negative terminal 25 is disposed on the side near the positive module 2p. The second intermediate terminal 242 is disposed on the side far from the positive module 2p. In addition, the vector component $V_{12}$ in the Y direction of the first vector $V_1$ and vector component $V_{22}$ in the Y direction of the first vector $V_2$ of the second vector $\bar{V}_2$ are opposite to each other. Other basic configurations are similar to those according to the first embodiment.

(Operational Effects of the Second Embodiment)

Next, operational effects of the power conversion device according to the second embodiment will be described. FIG. 9 shows the flow of the current i when the switching element 211 of the positive module 2p is switched from OFF to ON. As shown in FIG. 9, the current flows from the positive terminal 23 of the positive module 2p through the intermediate bus bar 4c (not shown) to the negative terminal 25 of the negative module 2n. Here, considering the current i flowing in the Y direction, the directions of the current i flowing to the conductive section 221 of the positive module 2p and the current i flowing to the conductive section 222 of the negative module 2n are opposite to each other.

Figure 10:
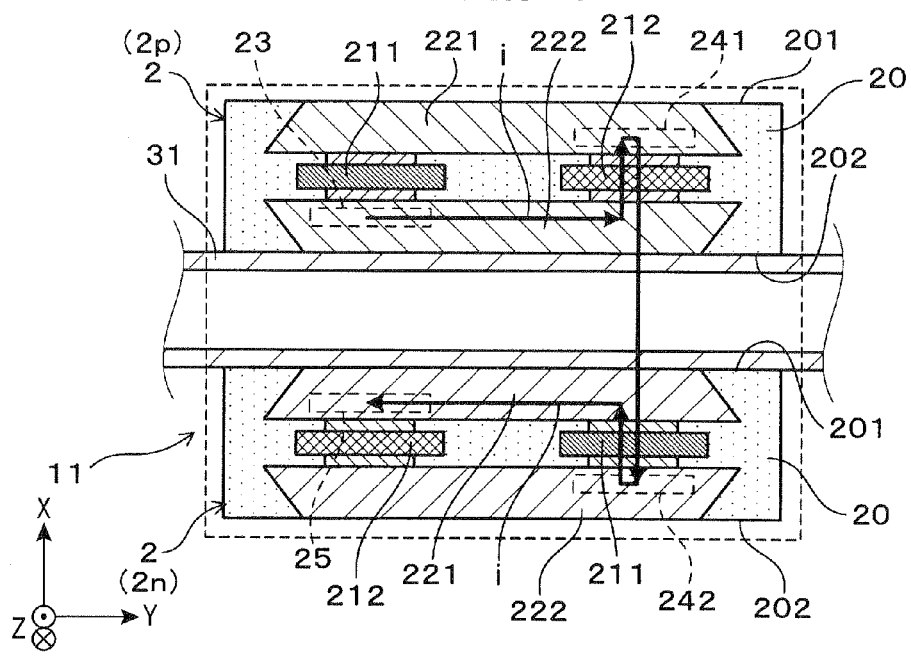
FIG. 10 shows the flow of the current i when the switching element 211 of the negative module 2n is switched from OFF to ON according to the second embodiment.

FIG. 10 shows the flow of the current i when the switching element 211 of the negative module 2n is switched from OFF to ON. The current i flows from the positive terminal 23 of the positive module 2p through the intermediate bus bar 4c (not shown) to the negative terminal 25 of the negative module 2n, as shown in FIG. 10. Here, considering the current i flowing in the Y direction, the directions of the current i flowing to the conductive section 222 of the positive module 2p and the current i flowing to the conductive section 221 of the negative module 2n are opposite to each other.

Therefore, according to the second embodiment as well, in a manner similar to that according to the above-described first embodiment, the mutual inductance effect between the positive module 2p and the negative module 2n can be sufficiently achieved. As a result, reduction of inductance can be sufficiently achieved with a simple structure. Other basic operational effects are similar to those of the power conversion device 1 according to the first embodiment.

Third Embodiment

Figure 11:
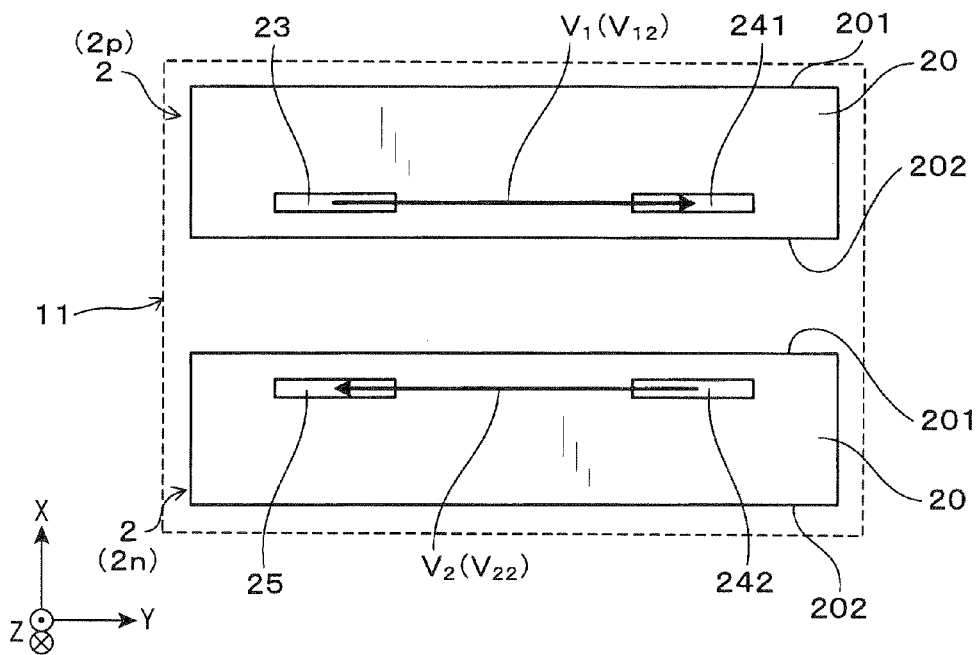
FIG. 11 shows a top view of the module unit according to the third embodiment.

Next, a third embodiment of the power conversion device will be explained using FIG. 11 to FIG. 13. The third embodiment is a further modification of the module unit 11. FIG. 11 shows a top view of the module unit 11 of the third embodiment.

As shown in FIG. 11, the first vector $V_1$ have only the vector components $V_{12}$ and the second vector $V_2$ have only the vector components $V_{22}$ in the Y direction, and do not have the vector components $V_{11}$ and $V_{21}$ in the X direction. The vector component $V_{12}$ in the Y direction of the first vector $V_1$ and the vector component and $V_{22}$ in the Y direction of the second vector $V_2$ are opposite to each other. Other basic configurations are similar to those according to the first embodiment.

Figure 12:
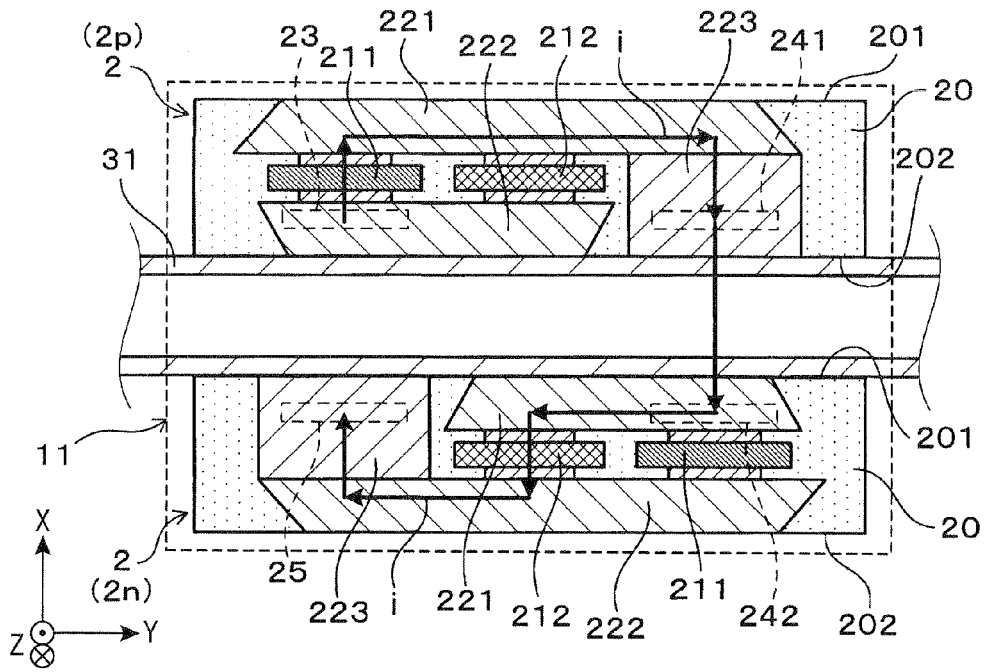
FIG. 12 shows a flow of a current (i) when a switching element of the positive module 2p is switched from OFF to ON according to the third embodiment.
Figure 13:
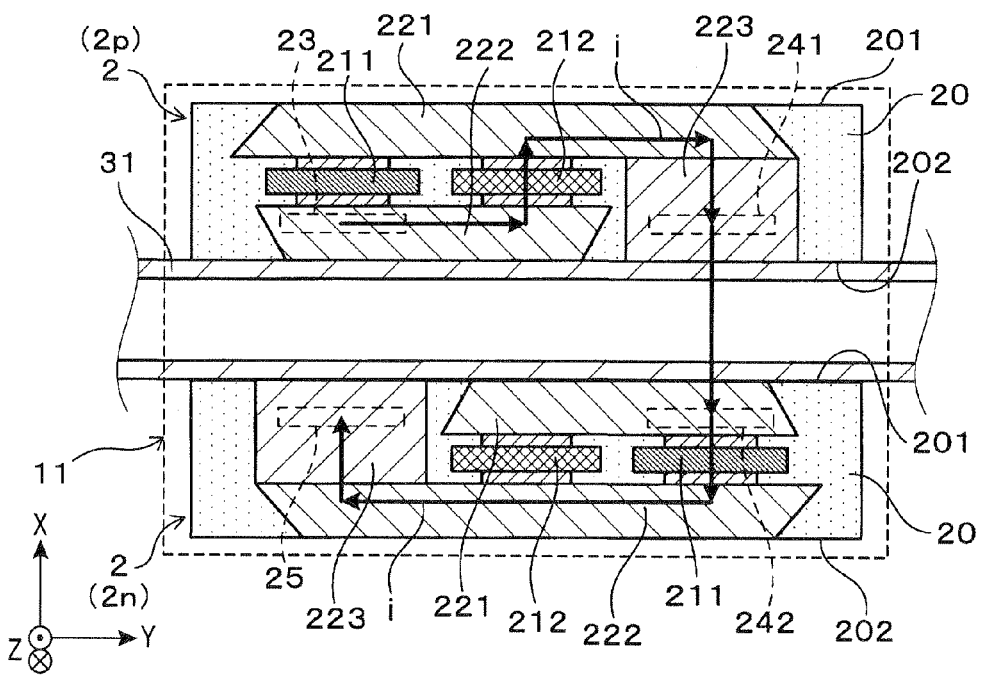
FIG. 13 shows the flow of the current i when the switching element of the negative module is switched from OFF to ON according to the third embodiment.

As shown in FIG. 12 and FIG. 13, according to the third embodiment, the main body section 20 of the positive module 2p has, in addition to the pair of conductive sections 221 and 222 disposed on both sides in the X direction of the switching element 211 and the diode 212, a conductive section 223 that is exposed on the main surface 202 and connected to the conductive section 221.

In the main body section 20 of the positive module 2p, the positive terminal 23 and the first intermediate terminal 241 are disposed in the same position in the X direction. The negative terminal 23 is connected to the conductive section 222 and the first intermediate terminal 241 is connected to the conductive section 223. In addition, the positive terminal 23 is aligned in the X direction with the switching element 211.

As shown in FIG. 12 and FIG. 13, the main body section 20 of the negative module 2n has, in addition to the pair of conductive sections 221 and 222 disposed on both sides in the Y direction of the switching element 211 and the diode 212, a conductive section 223 that is exposed on the main surface 201 and connected to the conductive section 222.

In the main body section 20 of the negative module 2n, the negative terminal 25 and the second intermediate terminal 242 are disposed in the same position in the X direction. The negative terminal 25 is connected to the conductive section 223 and the second intermediate terminal 242 is connected to the conductive section 221. In addition, the negative terminal 25 is aligned in the X direction with the diode 212.

(Operational Effects of the Third Embodiment)

Next, operational effects of the power conversion device according to the third embodiment will be described. FIG. 12 shows the flow of the current i when the switching element 211 of the positive module 2p is switched from OFF to ON.

As shown in FIG. 12 the current flows from the positive terminal 23 of the positive module 2p through the intermediate bus bar 4c (not shown) to the negative terminal 25 of the negative module 2n. Here, considering the current i flowing in the Y direction, the directions of the current i flowing to the conductive section 221 of the positive module 2p and the current i flowing to the conductive sections 221 and 222 of the negative module 2n are opposite to each other.

FIG. 13 shows the flow of the current i when the switching element 211 of the negative module 2n is switched from OFF to ON. As shown in FIG. 13, the current i flows from the positive terminal 23 of the positive module 2p through the intermediate bus bar 4c (not shown) to the negative terminal 25 of the negative module 2n. Here, considering the current i flowing in the Y direction, the directions of the current i flowing to the conductive section 221 and 222 of the positive module 2p and the current i flowing to the conductive section 222 of the negative module 2n are opposite to each other.

Therefore, according to the third embodiment as well, in a manner similar to that according to the above-described first embodiment, the mutual inductance effect between the positive module 2p and the negative module 2n can be sufficiently achieved. As a result, reduction of inductance can be sufficiently achieved with a simple structure. Other basic operational effects are similar to those according to the first embodiment.

Fourth Embodiment

Figure 14:
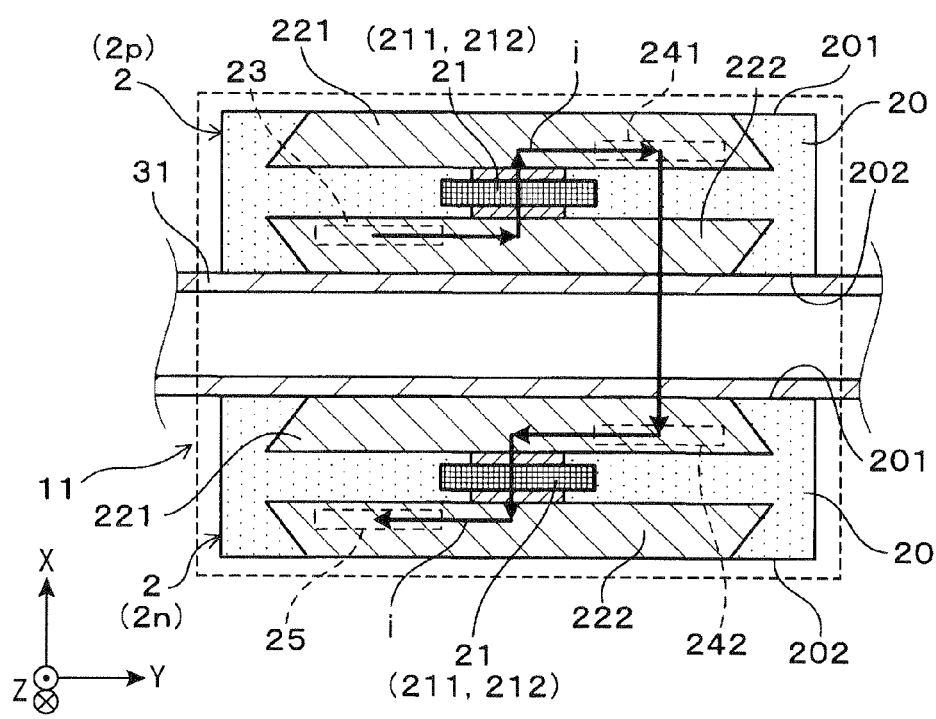
FIG. 14 shows the flow of the current i when the switching element of the positive module 2p is switched from OFF to ON according to a fourth embodiment.

Furthermore, a fourth embodiment of the power conversion device will be explained using FIG. 14. The fourth embodiment is a further altered configuration of the module unit 11. As shown in FIG. 14, according to the fourth embodiment, a semiconductor element section 21 is embedded within a main body 20 of the positive module 2p and negative module 2n, wherein the semiconductor element section 21 is configured integrally with the switching element 211 and the diode 212. Other basic configurations are similar to those according to the first embodiment.

(Operational Effects of the Fourth Embodiment)

Next, operational effects achieved by the power conversion device according to the fourth embodiment will be described. FIG. 14 shows the flow of the current i when the switching element 211 of the positive module 2p is switched from OFF to ON. The flow of the current when the switching element 211 of the negative module 2n is switched from OFF to ON is also similar. As shown in FIG. 14, the current i flows from the positive terminal 23 of the positive module 2p through the intermediate bus bar 4c (not shown) to the negative terminal 25 of the negative module 2n. Here, considering the current i flowing in Y direction, the directions of the current i flowing to the conductive sections 221 and 222 of the positive module 2p and the current i flowing to the conductive sections 221 and 222 of the negative module 2n are opposite to each other.

Therefore, according to the fourth embodiment as well, in a manner similar to that according to the above-described first embodiment, the mutual inductance effect between the positive module 2p and the negative module 2n can be sufficiently achieved. As a result, reduction of inductance can be sufficiently achieved with a simple structure. Other basic operational effects are similar to those of the power conversion device 1 according to the first embodiment.

Fifth Embodiment

Figure 15:
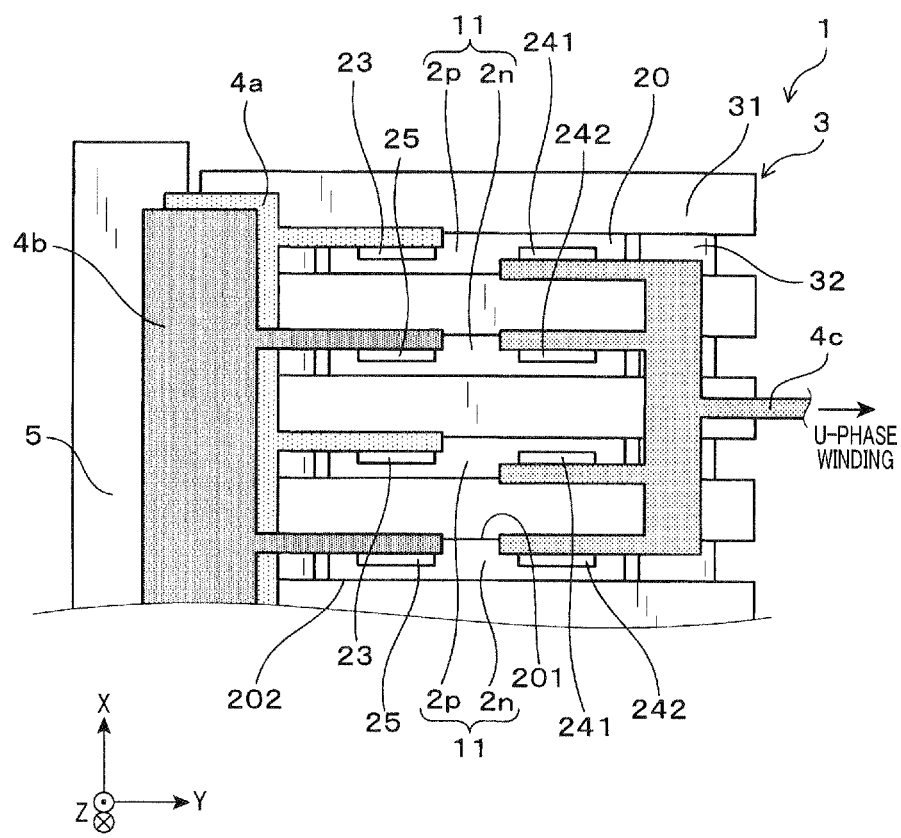
FIG. 15 shows a partial explanatory diagram (top view) of a power conversion device according to a fifth embodiment.

Next, A fifth embodiment of the power conversion device will be explained using FIG. 15. The fifth embodiment is other example of the configuration of the module unit 11. As shown in FIG. 15, according to the fifth embodiment, module units 11 are connected to each other in parallel. The positive module 2p and the negative module 2n form a single module unit 11. Specifically, the first intermediate terminal 241 of the positive module 2p and the second intermediate terminal 242 of the negative module 2n of one module unit 11 is connected by a single, common intermediate bus bar 4c to the first intermediate terminal 241 of the positive module 2p and the second intermediate terminal 242 of the negative module 2n of the other module unit 11.

In addition, the positive module 2p of one module unit 11 and the negative module 2n of the other module unit 11 are disposed such that the main surface 201 and the main surface 202 of the respective main body sections 20 oppose each other. In FIG. 15, the intermediate bus bar 4c connected to the U-phase winding of the three-phase alternating-current motor 82 is only shown. However, other intermediate bus bars 4c (not shown) connected to the other V-phase winding and W-phase winding of the three-phase alternating-current motor 82 also have a similar configuration. Other basic configurations are similar to those according to the first embodiment.

According to the fifth embodiment, in a manner similar to the above-described power conversion device 1 according to the first embodiment, the mutual inductance effect between the positive module 2p and the negative module 2n within the module unit 11 can be achieved. In addition, the mutual inductance effect between module units 11 that are adjacent to each other, or in other words, between the positive module 2p of one module unit 11 and the negative module 2n of the other module unit 11 can be achieved still more. Therefore, further reduction of inductance can be achieved. Other basic operational effects are similar to those of the power conversion device 1 according to the first embodiment.

Sixth Embodiment

Figure 16:
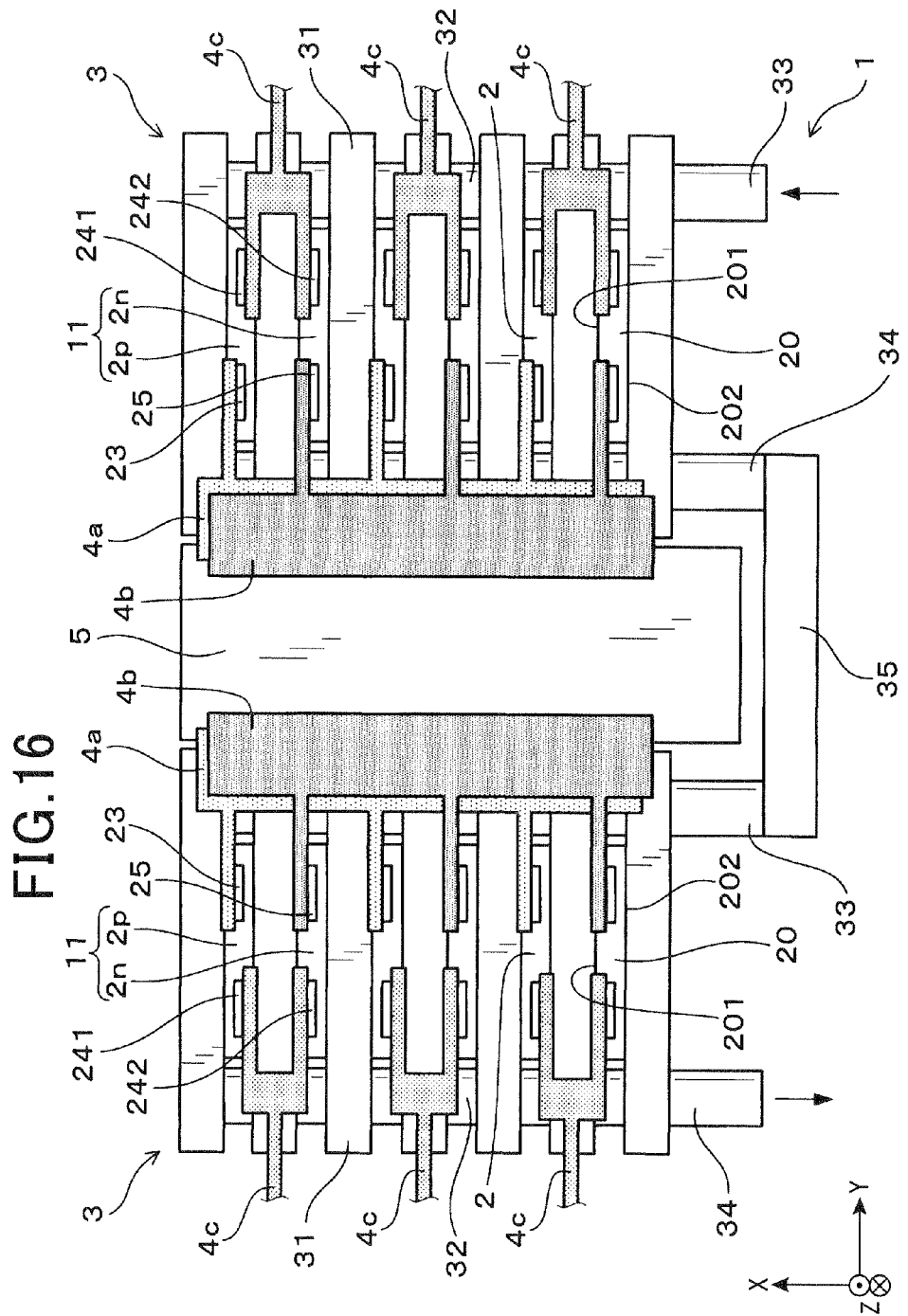
FIG. 16 shows an explanatory diagram (top view) of a power conversion device according to a sixth embodiment.

Next, a sixth embodiment of the power conversion device will be explained using FIG. 16. The sixth embodiment is an example of the configuration of the power conversion device 1. As shown in FIG. 16, the power conversion device 1 according to the sixth embodiment drives two three-phase alternating-current motors 82 (not shown). The plurality of semiconductor modules 2, the coolers 3, the plurality of bus bars (positive bus bars 4a, negative bus bars 4b, and intermediate bus bars 4c), and the like are disposed on both sides of the capacitor 5.

The first intermediate terminals 241 and the second intermediate terminals 242 of the semiconductor modules 2 disposed on one side of the capacitor 5 are connected to the intermediate bus bars 4c that are respectively connected to the electrodes of one three-phase alternating-current motor 82. The first intermediate terminals 241 and the second intermediate terminals 242 of the semiconductor modules 2 disposed on the other side of the capacitor 5 are connected to the intermediate bus bars 4c that are respectively connected to the electrodes of the other three-phase alternating-current motor 82.

The coolant discharge tube 34 of the cooler 3 disposed on one of the capacitor 5 and the coolant inlet tube 33 of the cooler 3 disposed on the other side of the capacitor 5 are mutually connected by a connecting tube 35. Other basic configurations of the semiconductor modules 2, the coolers 3, the bus bars, and the like disposed on both sides of the capacitor 5 are similar to those according to the first embodiment.

According to the sixth embodiment, the semiconductor modules 2 are stacked on both sides of the capacitor 5. Therefore, space can be effectively used. As a result, the power conversion device 1 can be made more compact. Other basic operational effects are similar to those of the power conversion device 1 according to the first embodiment.

What is claimed is:

1. A power conversion device, wherein the device comprises a plurality of semiconductor modules each having a plate-shaped body incorporated with a switching element, wherein the plurality of semiconductor modules include a positive module connected to a positive side of a power supply and a negative module connected to a negative side of the power supply;

the positive module includes a positive terminal connected to the power supply and a first intermediate terminal connected to the negative module, the positive terminal and the first intermediate terminal being projected from the body;

the negative module includes a negative terminal connected to the power supply and a second intermediate terminal connected to the positive module, the negative terminal and the second intermediate terminal being projected from the body;

the first intermediate terminal and the second intermediate terminal are connected to each other via an intermediate bus bar;

the positive module and the negative module are arranged in a state where main surfaces of the respective bodies are opposed to each other, in a module unit composed of the positive module and the negative module adjacent to each other and connected to each other via the intermediate bus bar;

the positive terminal, the first intermediate terminal, the negative terminal and the second intermediate terminal of both the positive and negative modules are projected into the same or a mutually opposite direction, the direction being a projecting direction perpendicular to a facing direction of the both; and a first vector directed to the first intermediate terminal from the positive terminal of the positive module and a second vector directed to the negative terminal from the second intermediate terminal of the negative module have respective vector components in a perpendicular direction that is perpendicular to the facing direction, the vector components being directed to mutually opposite directions when the module unit is seen from the projecting direction.

2. The power conversion device according to claim 1, wherein: the body of the positive module in the module unit includes conductors that electrically connect between the positive terminal and the first intermediate terminal via the switching element; and the body of the negative module includes conductors that electrically connect between the negative terminal and the second intermediate terminal via the switching element.

3. The power conversion device according to claim 2, wherein the conductors are at least partially exposed to the main surfaces of the respective bodies.

4. The power conversion device according to claim 2, wherein: the body of the positive module in the module unit includes the conductors, in a pair, arranged on both sides of the switching element in the facing direction and connected to the positive terminal and the first intermediate terminal, respectively; and the body of the negative module includes the conductors, in a pair, arranged on both sides of the switching element in the facing direction and connected to the negative terminal and the second intermediate terminal, respectively.

5. The power conversion device according to claim 4, wherein the bodies of the positive module and the negative module in the module unit are each incorporated with a diode being juxtaposed with the switching element in the perpendicular direction; the switching element of the positive module and the diode of the negative module are arranged being opposed to each other in the facing direction; and the diode of the positive module and the switching element of the negative module are arranged being opposed to each other in the facing direction.

6. The power conversion device according to claim 5, wherein when the module unit is seen from the projecting direction: the switching element and the positive terminal are arranged being juxtaposed in the facing direction, while the diode and the first intermediate terminal are arranged being juxtaposed in the facing direction in the positive module; and the switching element and the second intermediate terminal are arranged being juxtaposed in the facing direction, while the diode and the negative terminal are arranged being juxtaposed in the facing direction in the negative module.

7. The power conversion device according to claim 1, wherein the device comprises a plurality of the module units, with adjacently located module units being arranged such that the main surfaces of the respective bodies of the positive module of one module unit and of the negative module of the other module unit are opposed to each other.

8. The power conversion device according to claim 1, wherein: the device comprises a cooler having coolant paths that pass a coolant therethrough to cool the semiconductor modules; and the semiconductor modules and the coolant paths are alternately stacked in the facing direction.

9. The power conversion device according to claim 3, wherein: the body of the positive module in the module unit includes the conductors, in a pair, arranged on both sides of the switching element in the facing direction and connected to the positive terminal and the first intermediate terminal, respectively; and the body of the negative module includes the conductors, in a pair, arranged on both sides of the switching element in the facing direction and connected to the negative terminal and the second intermediate terminal, respectively.

10. The power conversion device according to claim 9, wherein the bodies of the positive module and the negative module in the module unit are each incorporated with a diode being juxtaposed with the switching element in the perpendicular direction; the switching element of the positive module and the diode of the negative module are arranged being opposed to each other in the facing direction; and the diode of the positive module and the switching element of the negative module are arranged being opposed to each other in the facing direction.

11. The power conversion device according to claim 10, wherein when the module unit is seen from the projecting direction: the switching element and the positive terminal are arranged being juxtaposed in the facing direction, while the diode and the first intermediate terminal are arranged being juxtaposed in the facing direction in the positive module; and the switching element and the second intermediate terminal are arranged being juxtaposed in the facing direction, while the diode and the negative terminal are arranged being juxtaposed in the facing direction in the negative module.

12. The power conversion device according to claim 2, wherein the device comprises a plurality of the module units, with adjacently located module units being arranged such that the main surfaces of the respective bodies of the positive module of one module unit and of the negative module of the other module unit are opposed to each other.

13. The power conversion device according to claim 2, wherein: the device comprises a cooler having coolant paths that pass a coolant therethrough to cool the semiconductor modules; and the semiconductor modules and the coolant paths are alternately stacked in the facing direction.

14. The power conversion device according to claim 3, wherein the device comprises a plurality of the module units, with adjacently located module units being arranged such that the main surfaces of the respective bodies of the positive module of one module unit and of the negative module of the other module unit are opposed to each other.

15. The power conversion device according to claim 3, wherein: the device comprises a cooler having coolant paths that pass a coolant therethrough to cool the semiconductor modules; and the semiconductor modules and the coolant paths are alternately stacked in the facing direction.

* * * * *